(12) United States Patent
Ohno

(10) Patent No.: US 9,005,462 B2
(45) Date of Patent: Apr. 14, 2015

(54) METHOD FOR MANUFACTURING SILICON CARBIDE SEMICONDUCTOR DEVICE

(75) Inventor: Jun-ichi Ohno, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 13/884,166

(22) PCT Filed: Sep. 9, 2011

(86) PCT No.: PCT/JP2011/070590
§ 371 (c)(1),
(2), (4) Date: May 8, 2013

(87) PCT Pub. No.: WO2012/140794
PCT Pub. Date: Oct. 18, 2012

(65) Prior Publication Data
US 2013/0244428 A1 Sep. 19, 2013

(30) Foreign Application Priority Data

Apr. 11, 2011 (JP) .................. 2011-086984

(51) Int. Cl.
| | | |
|---|---|---|
| *C03C 15/00* | (2006.01) | |
| *H01L 21/768* | (2006.01) | |
| *H01L 21/04* | (2006.01) | |
| *H01L 29/45* | (2006.01) | |
| *H01L 29/66* | (2006.01) | |
| *H01L 29/872* | (2006.01) | |

(Continued)

(52) U.S. Cl.
CPC ...... *H01L 21/76889* (2013.01); *H01L 21/0485* (2013.01); *H01L 29/45* (2013.01); *H01L 29/66143* (2013.01); *H01L 29/872* (2013.01); *H01L 21/3065* (2013.01); *H01L 29/6606* (2013.01); *H01L 23/4827* (2013.01); *H01L 29/1608* (2013.01); *H01L 29/8611* (2013.01); *H01L 2924/0002* (2013.01)

(58) Field of Classification Search
USPC .............. 216/37, 67; 438/669, 689, 704, 710, 438/719, 723
See application file for complete search history.

(56) References Cited

U.S. PATENT DOCUMENTS 6,207,565 B1 * 3/2001 Yeh et al. ........................ 438/669
7,166,523 B2 * 1/2007 Nagasawa ..................... 438/478
(Continued)

FOREIGN PATENT DOCUMENTS

| JP | 2003243323 A | 8/2003 |
|---|---|---|
| JP | 2006024880 A | 1/2006 |

(Continued)

OTHER PUBLICATIONS

International Search Report of Application No. PCT/JP2011/070590 mailed Nov. 22, 2011.

*Primary Examiner* — Duy Deo
*Assistant Examiner* — Maki Angadi
(74) *Attorney, Agent, or Firm* — Lowe Hauptman & Ham, LLP

(57) ABSTRACT

In a method for manufacturing a silicon carbide semiconductor device, a conductive layer is formed on a silicon carbide layer. The silicon carbide layer and the conductive layer react with each other thus forming an alloy layer formed of a reaction layer in contact with the silicon carbide layer and a silicide layer on the reaction layer. A carbon component is removed from the silicide layer. A portion of the silicide layer is removed using an acid thus exposing at least a portion of the reaction layer. An electrode layer is formed on an upper side of the exposed reaction layer.

5 Claims, 7 Drawing Sheets

(51) Int. Cl.
  *H01L 21/3065* (2006.01)
  *H01L 23/482* (2006.01)
  *H01L 29/16* (2006.01)
  *H01L 29/861* (2006.01)

(56) References Cited

U.S. PATENT DOCUMENTS 8,114,783 B2 * 2/2012 Kawada et al. ............... 438/761

2006/0205195 A1 9/2006 Malhan et al.
2008/0041823 A1 * 2/2008 La et al. .................. 216/97

FOREIGN PATENT DOCUMENTS

| JP | 2006261624 A | 9/2006 |
| JP | 2008053291 A | 3/2008 |
| JP | 2009010096 A | 1/2009 |
| JP | 2010205824 A | 9/2010 |

* cited by examiner

METHOD FOR MANUFACTURING SILICON CARBIDE SEMICONDUCTOR DEVICE

RELATED APPLICATIONS

The present application is a National Phase of International Application Number PCT/JP2011/070590, filed Sep. 9, 2011, and claims priority from Japanese Application Number 2011-086984, filed Apr. 11, 2011.

TECHNICAL FIELD

The present invention relates to a method for manufacturing a silicon carbide semiconductor device.

BACKGROUND ART

A silicon carbide semiconductor device is a semiconductor device which includes a silicon carbide layer, and has excellent technical features such as a high breakdown voltage, low loss, a low leakage current, high-temperature operability, and high-speed operability. Accordingly, the application of the silicon carbide semiconductor device to a power element such as a switching element or a rectifying element has been highly anticipated. As the power element, although a power MOSFET, an IGBT, a Schottky diode, a pn diode, a thyristor or the like has been known, all these power elements have an ohmic electrode which is in contact with a silicon carbide layer so that, in many cases, an electric current of several amperes flows between the silicon carbide layer and the ohmic electrode.

Conventionally, as a method for manufacturing a silicon carbide semiconductor device, there has been known a method described in patent literature 1 (a conventional method for manufacturing a silicon carbide semiconductor device). FIG. 8 is a view for explaining the conventional method for manufacturing a silicon carbide semiconductor device. FIG. 8($a$) to FIG. 8($e$) are views showing respective steps.

The conventional method for manufacturing a silicon carbide semiconductor device sequentially includes, as shown in FIG. 8, a conductive layer forming step where a conductive layer 922 made of nickel is formed on a silicon carbide layer 910 (see FIG. 8($a$)), a heat treatment step where the silicon carbide layer 910 and the conductive layer 922 are made to react with each other thus forming an alloy layer formed of a reaction layer 920 which is in contact with the silicon carbide layer 910 and a silicide layer 924 present on the reaction layer 920 (see FIG. 8($b$) and FIG. 8($c$)), an etching step where at least a portion of the silicide layer 924 is removed using an acid thus exposing at least a portion of a surface of the reaction layer 920 (see FIG. 8($d$)), and an electrode layer forming step where an electrode layer 930 and other electrode layers 932 are formed on the exposed surface of the reaction layer 920 (see FIG. 8($e$)) in this order.

According to the conventional method for manufacturing a silicon carbide semiconductor device, the alloy layer formed of the reaction layer 920 and the silicide layer 924 is formed on the surface of the silicon carbide layer 910 and, thereafter, the surface of the reaction layer 920 is exposed, and the electrode layer 930 and another electrode layer 932 are formed on the exposed surface of the reaction layer 920. Accordingly, not only the electrode layer 930 and the silicon carbide layer 910 are favorably bonded to each other with the reaction layer 920 interposed therebetween but also it is possible to eliminate a possibility that a carbon component in the silicon carbide layer 910 diffuses into the electrode layer 930.

As a result, the concentration of carbon in the surface of the electrode layer 930 can be lowered and hence, the adhesiveness between the electrode layer 930 and the other electrode layer 932 formed on the electrode layer 930 can be improved. Accordingly, it is possible to provide a highly reliable silicon carbide semiconductor device 900 where a possibility that the delamination of an electrode can be suppressed while ensuring a favorable contact between the silicon carbide layer and the electrode layer.

PRIOR ART LITERATURE

Patent Literature

Patent Literature 1: JP-A-2006-24880
Patent Literature 2: JP-A-2009-10096

SUMMARY OF THE INVENTION

Technical Problem

However, according to studies that the inventors of the present invention have made, it is found that, in the conventional method for manufacturing a silicon carbide semiconductor device, a nickel component in the silicide layer is selectively etched in the above-mentioned etching step so that a silicon component tends to remain on the reaction layer thus giving rise to a drawback that dispersion in device characteristics occurs.

There has been known a method for manufacturing a silicon carbide semiconductor device including a step where a silicide layer is removed by a CMP process in place of an etching process (another conventional method for manufacturing a silicon carbide semiconductor device, see patent literature 2, for example). According to this conventional method for manufacturing a silicon carbide semiconductor device, the silicide layer is removed by the CMP process and hence, there is no possibility that a silicon component remains on a reaction layer whereby it is possible to overcome a drawback that dispersion in device characteristics occurs. However, in this conventional method for manufacturing a silicon carbide semiconductor device, the silicide layer is removed by the CMP process and hence, there exists a drawback that productivity of the silicon carbide semiconductor devices is low.

The present invention has been made to overcome the above-mentioned drawbacks, and it is an object of the present invention to provide a method for manufacturing a silicon carbide semiconductor device which can overcome a drawback that dispersion in device characteristics occurs due to a silicon component remaining after an etching step, and also can manufacture silicon carbide semiconductor devices with high productivity.

Solution to Problem

[1] According to one aspect of the present invention, there is provided a method for manufacturing a silicon carbide semiconductor device which includes the steps in the following order: a conductive layer forming step where a conductive layer is formed on a silicon carbide layer; a heat treatment step where the silicon carbide layer and the conductive layer are made to react with each other thus forming a reaction layer which is in contact with the silicon carbide layer and a silicide layer which is present on the reaction layer; a first plasma asking step where a carbon component which the silicide layer contains is removed; an etching step where at least a portion of the silicide layer is removed using a hydrochloric acid, a nitric acid and a hydrofluoric acid thus exposing at least a portion of a surface of the reaction layer; and an electrode layer forming step where an electrode layer is formed on an upper side of the exposed reaction layer.

[2] In the method for manufacturing a silicon carbide semiconductor device of the present invention, the etching step is preferably carried out using an etchant which contains a hydrochloric acid, a nitric acid and a hydrofluoric acid.

[3] In the method for manufacturing a silicon carbide semiconductor device of the present invention, the content ratio among the hydrochloric acid, the nitric acid and the hydrofluoric acid which the etchant contains is preferably set such that, assuming the content of the nitric acid as 100 mol, the content of the hydrochloric acid falls within a range of 300 mol to 500 mol, and the content of the hydrofluoric acid falls within a range of 0.1 mol to 5 mol.

[4] In the method for manufacturing a silicon carbide semiconductor device of the present invention, the etching step preferably includes an etching step where an etchant A containing a hydrochloric acid is used and an etching step where an etchant B containing a nitric acid and a hydrofluoric acid is used.

[5] In the method for manufacturing a silicon carbide semiconductor device of the present invention, the content ratio between the nitric acid and the hydrofluoric acid which the etchant B contains is preferably set such that, assuming the content of the nitric acid as 100 mol, the content of the hydrofluoric acid falls within a range of 0.1 mol to 5 mol.

[6] In the method for manufacturing a silicon carbide semiconductor device of the present invention, the first plasma ashing step is preferably carried out using any one of an oxygen gas, a hydrogen gas and a mixed gas of an oxygen gas and a hydrogen gas.

[7] In the method for manufacturing a silicon carbide semiconductor device of the present invention, the method preferably further comprises a second plasma ashing step where a carbon component which may remain on the reaction layer is removed between the etching step and the electrode layer forming step.

[8] In the method for manufacturing a silicon carbide semiconductor device of the present invention, the second plasma ashing step is preferably carried out using any one of an oxygen gas, a hydrogen gas and a mixed gas of an oxygen gas and a hydrogen gas.

[9] In the method for manufacturing a silicon carbide semiconductor device of the present invention, the method further preferably includes a second etching step where an oxidation layer formed by the second plasma ashing step is removed between the second plasma ashing step and the electrode layer forming step.

Advantageous Effects of Invention

According to the method for manufacturing a silicon carbide semiconductor device of the present invention, the etching step is carried out using a hydrochloric acid, a nitric acid and a hydrofluoric acid and hence, both components, that is, a nickel component and a silicon component can be removed by the etching step. Accordingly, it is possible to overcome a drawback that dispersion in device characteristics occurs due to a silicon component remaining after an etching step.

Further, according to the method for manufacturing a silicon carbide semiconductor device of the present invention, the silicide layer is removed by an etching process instead of a CMP process and hence, silicon carbide semiconductor devices can be manufactured with higher productivity than other conventional methods for manufacturing a silicon carbide semiconductor device.

Accordingly, the present invention can provide a method for manufacturing a silicon carbide semiconductor device which can overcome a drawback that dispersion in device characteristics occurs due to a silicon component remaining after an etching step. With the use of this method for manufacturing a silicon carbide semiconductor device, it is also possible to manufacture silicon carbide semiconductor devices with high productivity.

DESCRIPTION OF EMBODIMENTS

Figure 1:
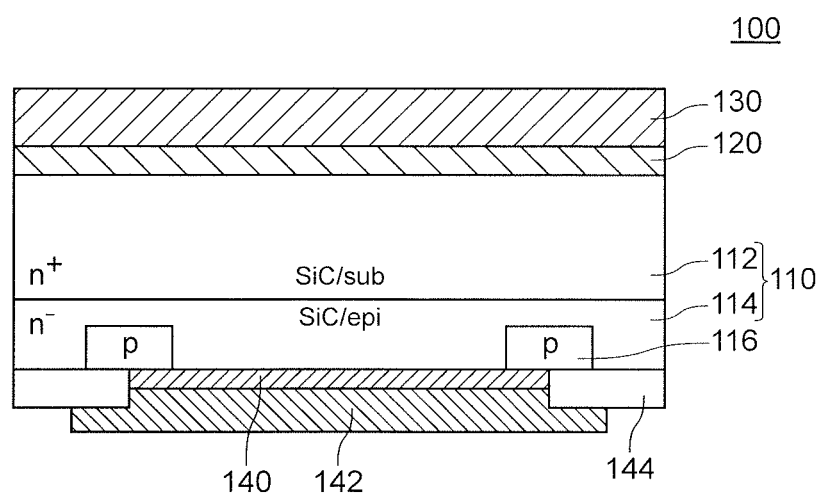
[FIG. 1]
A cross-sectional view of a silicon carbide semiconductor device 100 which is manufactured by a method for manufacturing a silicon carbide semiconductor device according to an embodiment 1.

Hereinafter, a method for manufacturing a silicon carbide semiconductor device of the present invention is explained in conjunction with embodiments shown in the drawings.
[Embodiment 1]
FIG. 1 is a cross-sectional view of a silicon carbide semiconductor device 100 which is manufactured by a method for manufacturing a silicon carbide semiconductor device according to an embodiment 1.

As shown in FIG. 1, the silicon carbide semiconductor device 100 is a Schottky diode which includes: a silicon carbide layer 110; a reaction layer 120 and a cathode electrode layer 130 (an electrode layer of the present invention) which are formed on a first main surface side of the silicon carbide layer 110; and a barrier metal layer 140, an anode electrode layer 142 and a protective insulation layer 144 which are formed on a second main surface side of the silicon carbide layer 110.

The silicon carbide layer 110 includes an n+ type silicon carbide substrate 112 and an n− type epitaxial layer 114 containing n-type impurities at a concentration lower than a concentration of n-type impurities contained in the n+ type silicon carbide substrate 112. A thickness of the n+ type silicon carbide substrate 112 is 300 µm, for example, and the concentration of n-type impurities in the n+ type silicon carbide substrate 112 is $1 \times 10^{19}$ cm$^{-3}$, for example. A thickness of the n− type epitaxial layer 114 is 10 µm, for example, and the concentration of n-type impurities in the n− type epitaxial layer 114 is $1 \times 10^{16}$ cm$^{-3}$, for example.

A p-type guard ring 116 is formed on a surface of the n− type epitaxial layer 114 on a second main surface side. A concentration of p-type impurities in the guard ring 116 falls within a range of $1 \times 10^{18}$ cm$^{-3}$ to $1 \times 10^{19}$ cm$^{-3}$, for example.

The reaction layer 120 is a layer which is formed by the diffusion of a nickel component into the n+ type silicon carbide substrate 112. A concentration of nickel in the reaction layer 120 falls within a range of $1.0 \times 10^{3}$ cm$^{-3}$ to $1.0 \times 10^{4}$ cm$^{-3}$, for example, and the concentration of nickel is gradually lowered along with the increase of a distance from a bonding surface between the reaction layer 120 and the cathode electrode layer 130. A thickness of the reaction layer 120 falls within a range of 10 nm to 200 nm, for example.

The cathode electrode layer 130 is formed by depositing metal (nickel, for example) which is a cathode electrode forming material on the reaction layer 120 by vapor deposition. A thickness of the cathode electrode layer 130 is 2 µm, for example.

The barrier metal layer 140 is made of metal (nickel, titanium or the like, for example) which forms a Schottky junction with the silicon carbide layer 110 (n− type epitaxial layer 114). A thickness of the barrier metal layer 140 is 2 µm, for example. The anode electrode layer 142 is formed on a surface of the barrier metal layer 140. A thickness of the anode electrode layer 142 is 5 µm, for example. The anode electrode layer 142 is made of aluminum, for example. The protective insulation layer 144 is formed such that the protective insulation layer 144 surrounds the barrier metal layer 140 and the anode electrode layer 142.

The silicon carbide semiconductor device 100 having the above-mentioned constitution can be manufactured by the following method (the method for manufacturing a silicon carbide semiconductor device according to the embodiment 1). Hereinafter, the method for manufacturing a silicon carbide semiconductor device according to the embodiment 1 is explained in accordance with manufacturing steps.

FIG. 2 and FIG. 3 are views for explaining the method for manufacturing a silicon carbide semiconductor device according to the embodiment 1. FIG. 2(a) to FIG. 2(e) and FIG. 3(a) to FIG. 3(e) are views showing respective steps.

1. Silicon Carbide Layer Preparing Step

Figure 2A:
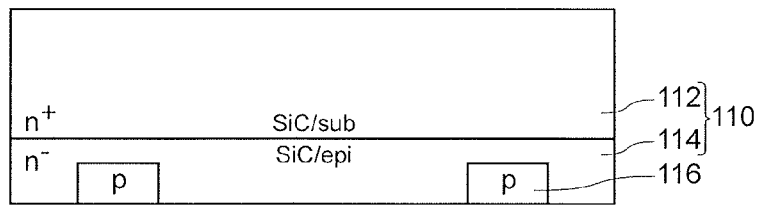
[FIG. 2]
A view for explaining the method for manufacturing a silicon carbide semiconductor device according to the embodiment 1.

Firstly, the silicon carbide layer 110 having the structure where the n+ type silicon carbide substrate 112 and the n− type epitaxial layer 114 are laminated to each other is prepared (see FIG. 2(a)). The p-type guard ring 116 is formed on the surface of the n− type epitaxial layer 114.

2. Conductive Layer Forming Step

Figure 2B:
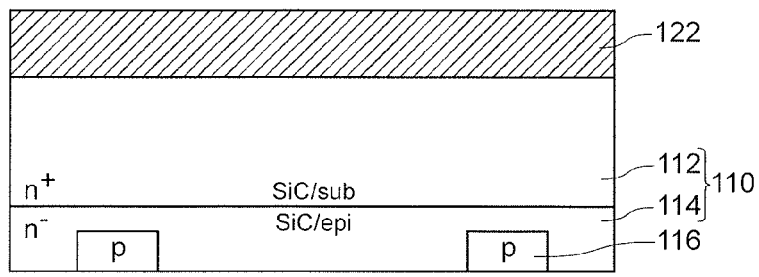

Next, a conductive layer 122 made of nickel is formed on a surface of the silicon carbide layer 110 (n+ type silicon carbide substrate 112) on a first main surface side by EB vapor deposition, for example (see FIG. 2(b)). A thickness of the conductive layer 122 is set to 50 nm to 500 nm, for example. As a material for forming the conductive layer 122, a metal material (aluminum, titanium, cobalt or the like) other than nickel may be used.

3. Heat Treatment Step

Next, heat treatment is performed such that the silicon carbide layer 110 (n+ type silicon carbide substrate 112) and the conductive layer 122 are made to react with each other thus forming an alloy layer formed of the reaction layer 120 which is in contact with the silicon carbide layer 110 (n+ type silicon carbide substrate 112) and a silicide layer 124 which is present on the reaction layer 120. Heat treatment is performed at a temperature of 1000° C. for 2 minutes in an inert atmosphere of highly purified argon (Ar) or the like from which moisture and oxygen are removed.

Figure 2C:
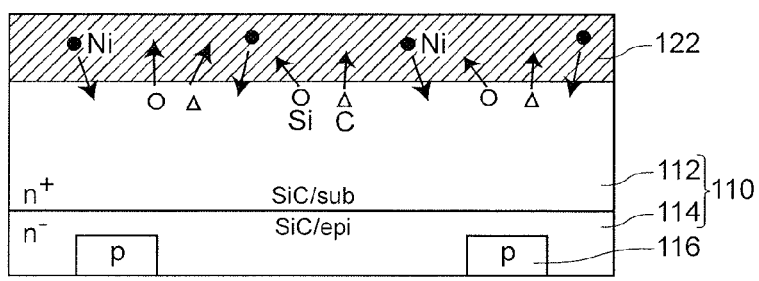
Figure 2D:
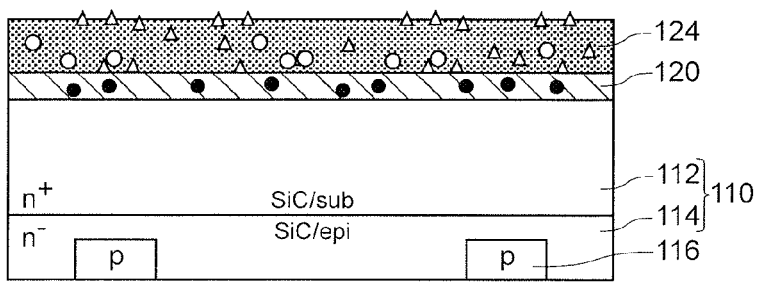

Due to such processing, the nickel component contained in the conductive layer 122 diffuses into the n+ type silicon carbide substrate 112 thus forming the reaction layer 120, and a silicon component and a carbon component contained in the n+ type silicon carbide substrate 112 diffuse into the conductive layer 122 thus forming the silicide layer 124 (see FIG. 2(c) and FIG. 2(d)).

4. First Plasma Ashing Step

Figure 2E:
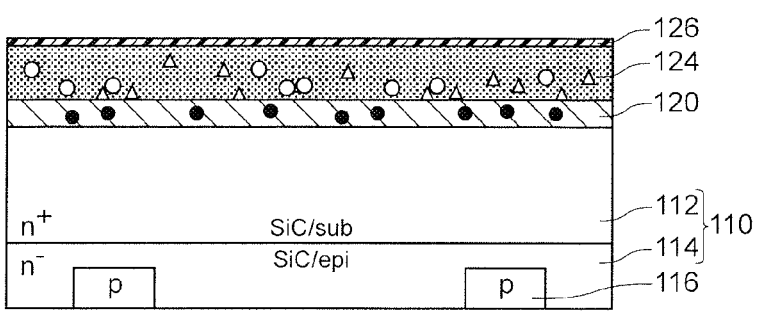

Next, the carbon component contained in the silicide layer 124 is removed by first plasma ashing (see FIG. 2(e)). The first plasma ashing is carried out using an oxygen gas. By carrying out the first plasma ashing step, the carbon component in the vicinity of a surface of the silicide layer 124 is removed and hence, an etching step described later can be efficiently carried out. In this step, by carrying out the first plasma ashing step, a nickel oxide layer 126 is formed on the surface of the silicide layer 124.

5. Etching Step

Figure 3A:
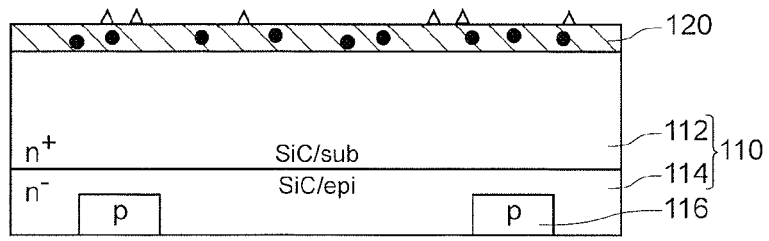
[FIG. 3]
A view for explaining the method for manufacturing a silicon carbide semiconductor device according to the embodiment 1.

Next, a surface of the reaction layer 120 is exposed by removing the silicide layer 124 using an etchant containing a hydrochloric acid, a nitric acid and a hydrofluoric acid (etchant) (see FIG. 3(a)).

In the etching step, the nickel component is removed from the silicide layer 124 by a hydrochloric acid, and the silicon component is removed from the silicide layer 124 by a nitric acid and a hydrofluoric acid. Also in the etching step, the nickel oxide layer 126 which is formed in the first plasma ashing step is also removed. The content ratio among the hydrochloric acid, the nitric acid and the hydrofluoric acid which the etchant contains is set such that, assuming the content of the nitric acid as 100 mol, the content of the hydrochloric acid falls within a range of 300 mol to 500 mol, and the content of the hydrofluoric acid falls within a range of 0.1 mol to 5 mol.

6. Second Plasma Ashing Step

Next, the carbon component on the surface of the reaction layer 120 is removed by second plasma ashing. The second plasma ashing is carried out using an oxygen gas. By carrying out the second plasma ashing, the carbon component can be removed from the surface of the reaction layer 120. In the second plasma ashing step, an oxidation layer 128 is formed on the surface of the reaction layer 120 (see FIG. 3(b)). The second plasma ashing step may be carried out using a hydrogen gas or a mixed gas of an oxygen gas and a hydrogen gas instead of using an oxygen gas.

7. Second Etching Step

Next, the oxidation layer 128 which is formed by the second plasma ashing step is removed using an etchant containing a hydrofluoric acid. In the second etching step, the second etching step is carried out under a condition where the oxidation layer 128 formed by the second plasma ashing step is completely removed (etching time: 3 minutes) (see FIG. 3(c)). By carrying out the second etching step, the cathode electrode layer 130 which is formed later and the silicon carbide layer 110 can be favorably bonded to each other with the reaction layer 120 interposed therebetween.

8. Cathode Electrode Layer Forming Step

Figure 3B:
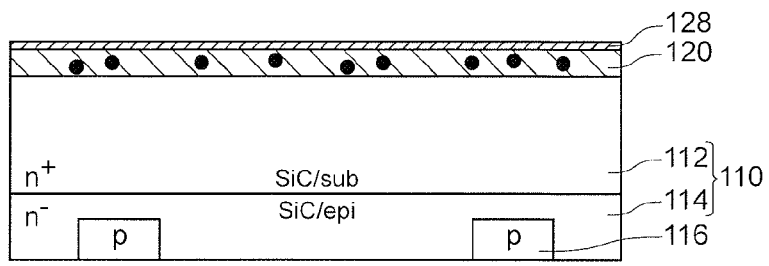
Figure 3C:
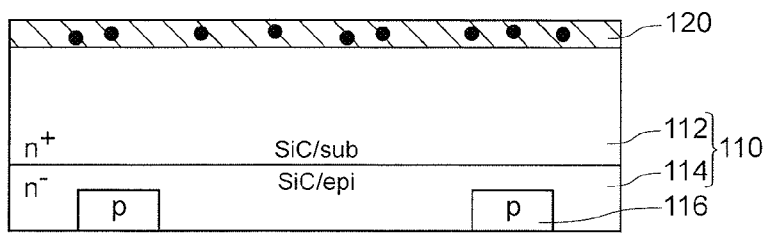
Figure 3D:
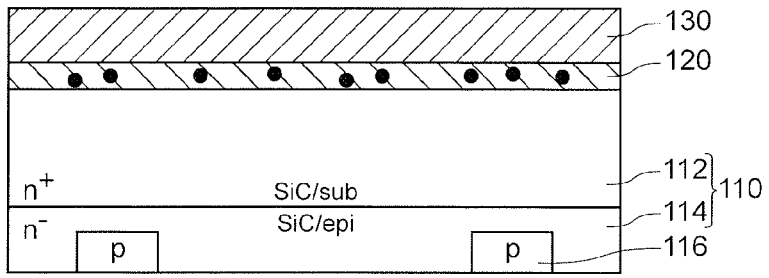

Next, the surface of the reaction layer 120 is cleaned (acid cleaning) and, thereafter, the cathode electrode layer 130 made of nickel is formed on the surface of the reaction layer 120 by physical vapor deposition (PVD) such as sputtering, for example (see FIG. 3(d)).

Figure 3E:
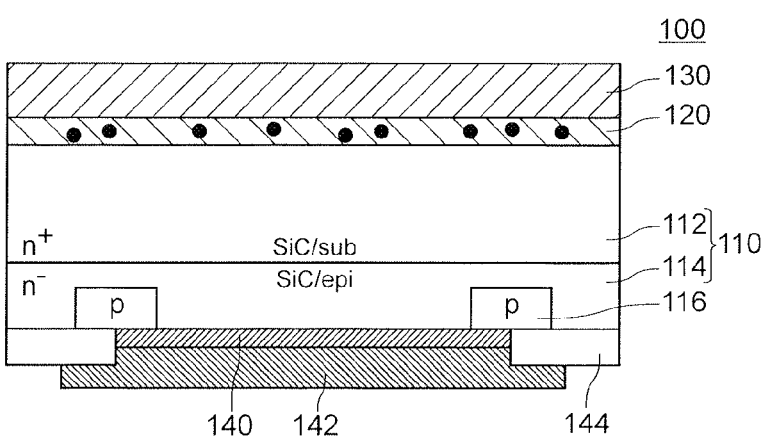

Next, the protective insulation layer 144, the barrier metal layer 140 and the anode electrode layer 142 are formed on the surface of the n⁻ type epitaxial layer 114 (see FIG. 3(e)).

By sequentially carrying out the above-mentioned steps, the silicon carbide semiconductor device 100 can be manufactured.

According to the method for manufacturing a silicon carbide semiconductor device of the embodiment 1, the etching step is carried out using a hydrochloric acid, a nitric acid and a hydrofluoric acid and hence, both components, that is, a nickel component and a silicon component can be removed by the etching step. Accordingly, it is possible to overcome a drawback that dispersion in device characteristics occurs due to a silicon component remaining after an etching step.

Further, according to the method for manufacturing a silicon carbide semiconductor device of the embodiment 1, the silicide layer is removed by an etching process instead of a CMP process and hence, silicon carbide semiconductor devices can be manufactured with higher productivity than other conventional methods for manufacturing a silicon carbide semiconductor device.

Accordingly, the method for manufacturing a silicon carbide semiconductor device according to the embodiment 1 can overcome a drawback that dispersion in device characteristics occurs due to a silicon component remaining after an etching step, and also can manufacture silicon carbide semiconductor devices with high productivity.

Further, according to the method for manufacturing a silicon carbide semiconductor device of the embodiment 1, the method further includes the second plasma ashing step where a carbon component which may remain on the reaction layer is removed between the etching step and the electrode layer forming step and hence, the adhesiveness between the reaction layer and the electrode layer can be further increased.

Further, according to the method for manufacturing a silicon carbide semiconductor device of the embodiment 1, the method further includes the second etching step where the oxidation layer formed by the second plasma ashing step is removed between the second plasma ashing step and the electrode layer forming step, and the second etching step is carried out under the condition where the oxidation layer formed by the second plasma ashing step is completely removed and hence, a resistance between the reaction layer and the electrode layer can be further reduced.

[Embodiment 2]

FIG. 4 is a view for explaining a method for manufacturing a silicon carbide semiconductor device according to an embodiment 2. FIG. 4(a) to FIG. 4(d) are views showing respective steps. The method for manufacturing a silicon carbide semiconductor device according to the embodiment 2 includes the substantially same steps as the method for manufacturing a silicon carbide semiconductor device according to the embodiment 1 except for steps corresponding to the steps of the method for manufacturing a silicon carbide semiconductor device according to the embodiment 1 which are shown in FIG. 2(e), FIG. 3(a) and FIG. 3(b) respectively. Accordingly, the illustration of the steps of the method for manufacturing a silicon carbide semiconductor device according to the embodiment 2 corresponding to the steps shown in FIG. 2(a) to FIG. 2(d) and FIG. 3(c) to FIG. 3(e) is omitted.

Although the method for manufacturing a silicon carbide semiconductor device according to the embodiment 2 basically includes the substantially same steps as the method for manufacturing a silicon carbide semiconductor device 100 according to the embodiment 1, the method for manufacturing a silicon carbide semiconductor device according to the embodiment 2 differs from the method for manufacturing a silicon carbide semiconductor device according to the embodiment 1 with respect to the details of the etching step. That is, in the method for manufacturing a silicon carbide semiconductor device according to the embodiment 2, an etching step where an etchant A containing a hydrochloric acid is used and an etching step where an etchant B containing a nitric acid and a hydrofluoric acid is used are carried out in this order.

Figure 4A:
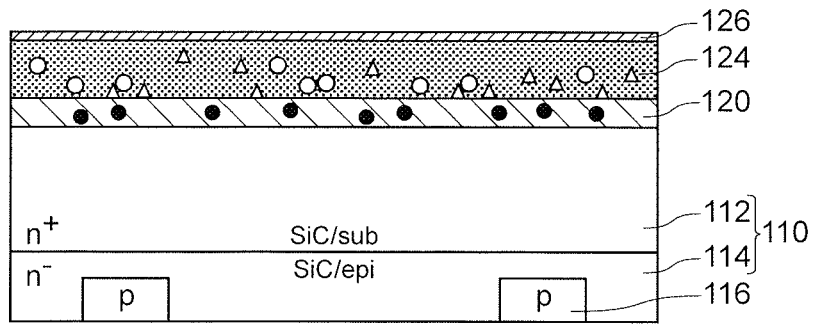
[FIG. 4]
A view for explaining a method for manufacturing a silicon carbide semiconductor device according to an embodiment 2.
Figure 4B:
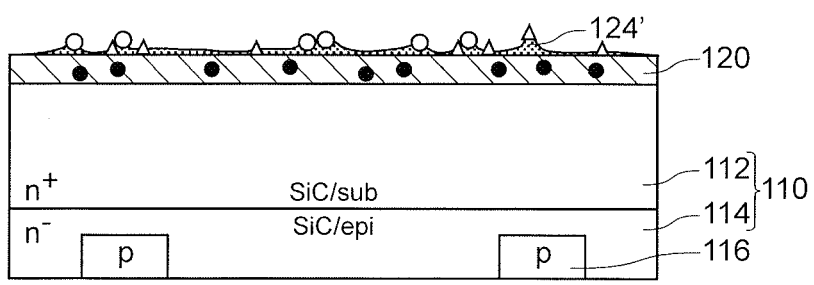

In the first etching step, using the etchant A containing a hydrochloric acid, a nickel component in a nickel oxide layer 126 which is formed by a first plasma asking step and a nickel component in a silicide layer 124 are removed (see FIG. 4(a) and FIG. 4(b)).

Figure 4C:
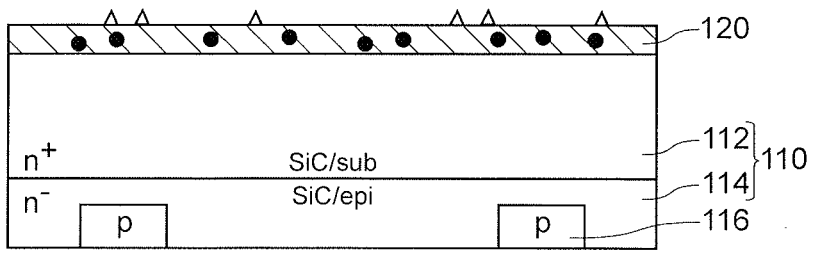

In the second etching step, a silicon component in the silicide layer 124 is removed using the etchant B containing a nitric acid and a hydrofluoric acid (see FIG. 4(b) and FIG. 4(c)). As the etchant B, an etchant is used where the content ratio between the nitric acid and the hydrofluoric acid is set such that, assuming the content of the nitric acid as 100 mol, the content of the hydrofluoric acid falls within a range of 0.1 mol to 5 mol.

By carrying out the first etching step and the second etching step as described above, at least a portion of a surface of a reaction layer 120 is exposed.

Figure 4D:
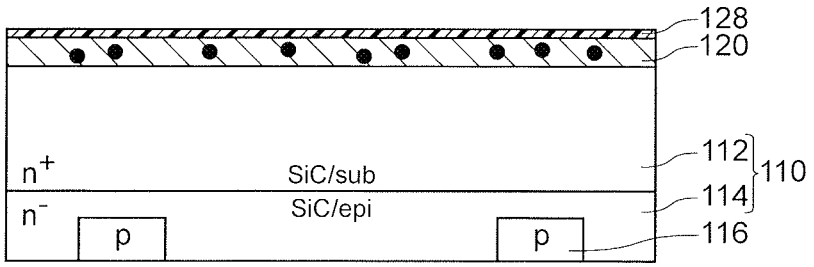

Thereafter, by sequentially carrying out a second plasma ashing step (see FIG. 4(d)) and an electrode layer forming step (see FIG. 3(c) and FIG. 3(d)), a silicon carbide semiconductor device 100 can be manufactured.

In this manner, although the method for manufacturing a silicon carbide semiconductor device according to the embodiment 2 differs from the method for manufacturing a silicon carbide semiconductor device according to the embodiment 1 with respect to the content of the etching step, in the same manner as the method for manufacturing a silicon carbide semiconductor device according to the embodiment 1, the etching step is carried out using a hydrochloric acid, a nitric acid and a hydrofluoric acid. Accordingly, both components, that is, a nickel component and a silicon component can be removed by the etching step. Accordingly, there is no possibility that dispersion in device characteristics occurs due to a silicon component remaining after the etching step.

Further, according to the method for manufacturing a silicon carbide semiconductor device of the embodiment 2, the silicide layer is removed by the etching process instead of a CMP process and hence, silicon carbide semiconductor devices can be manufactured with higher productivity than other conventional methods for manufacturing a silicon carbide semiconductor device.

Accordingly, the method for manufacturing a silicon carbide semiconductor device of the embodiment 2, in the same manner as the method for manufacturing a silicon carbide semiconductor device of the embodiment 1, can overcome a drawback that dispersion in device characteristics occurs due to a silicon component remaining after an etching step, and also can manufacture silicon carbide semiconductor devices with high productivity.

The method for manufacturing a silicon carbide semiconductor device according to the embodiment 2 includes the substantially same steps as the method for manufacturing a silicon carbide semiconductor device according to the embodiment 1 except for the etching step. Accordingly, the method for manufacturing a silicon carbide semiconductor device according to the embodiment 2 can acquire advantageous effects exactly equal to the advantageous effects acquired by the substantially same steps used in common by the embodiments 1 and 2 out of the advantageous effects that the method for manufacturing a silicon carbide semiconductor device according to the embodiment 1 possesses.

[Embodiment 3]

FIG. 5 is a view for explaining a method for manufacturing a silicon carbide semiconductor device according to an embodiment 3. FIG. 5(a) to FIG. 5(d) are views showing respective steps. FIG. 6 is a cross-sectional view of a silicon carbide semiconductor device 102 which is manufactured by the method for manufacturing a silicon carbide semiconductor device according to the embodiment 3.

The method for manufacturing a silicon carbide semiconductor device according to the embodiment 3 includes the substantially same steps as the method for manufacturing a silicon carbide semiconductor device according to the embodiment 1 with respect to steps corresponding to the steps in the method for manufacturing a silicon carbide semiconductor device according to the embodiment 1 which are shown in FIG. 2(a) to FIG. 2(e) and FIG. 3(a) and hence, the illustration of steps corresponding to the steps shown in FIG. 2(a) to FIG. 2(e) and FIG. 3(a) is omitted.

Although the method for manufacturing a silicon carbide semiconductor device according to the embodiment 3 basically includes the substantially same steps as the method for manufacturing a silicon carbide semiconductor device 100 according to the embodiment 1, the method for manufacturing a silicon carbide semiconductor device according to the embodiment 3 differs from the method for manufacturing a silicon carbide semiconductor device according to the embodiment 1 with respect to the details of a second etching step. That is, in the method for manufacturing a silicon carbide semiconductor device according to the embodiment 3, the second etching step is carried out under a condition where a portion of an oxidation layer 128 formed by a second plasma ashing step remains. To be more specific, in the method for manufacturing a silicon carbide semiconductor device according to the embodiment 3, the second etching step is carried out for an etching time shorter than an etching time of the method for manufacturing a silicon carbide semiconductor device according to the embodiment 1 (etching time: 3 minutes→2 minutes).

Figure 5A:
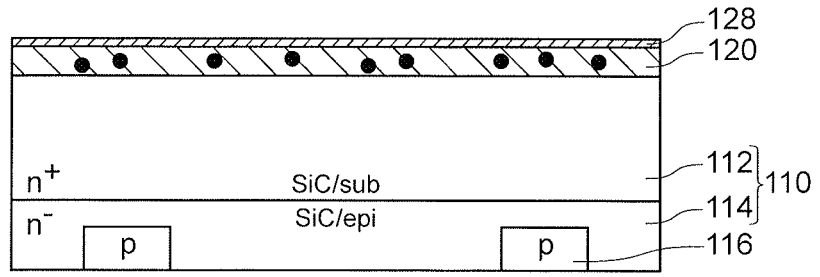
[FIG. 5]
A view for explaining a method for manufacturing a silicon carbide semiconductor device according to an embodiment 3.
Figure 5B:
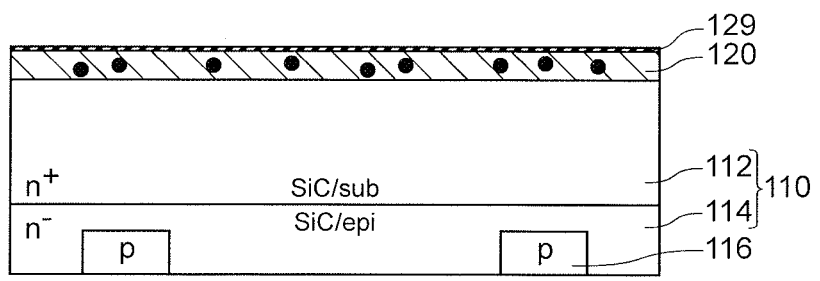
Figure 5C:
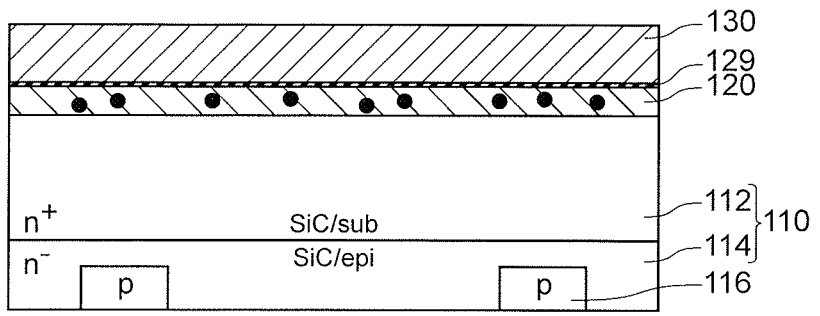
Figure 5D:
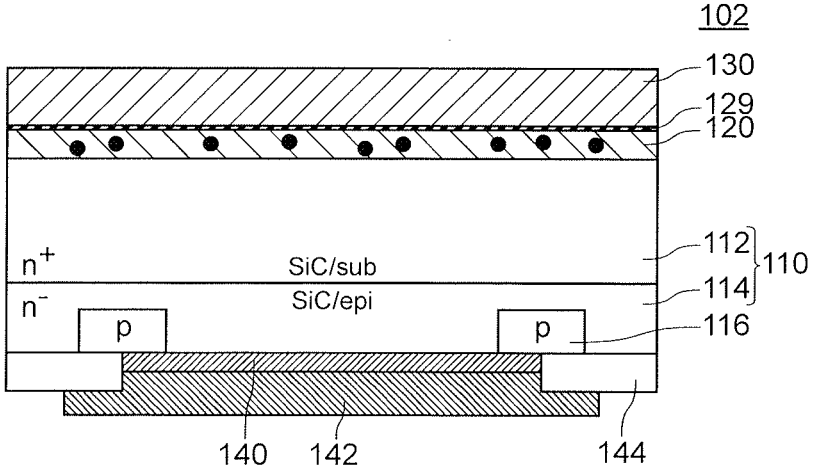
Figure 6:
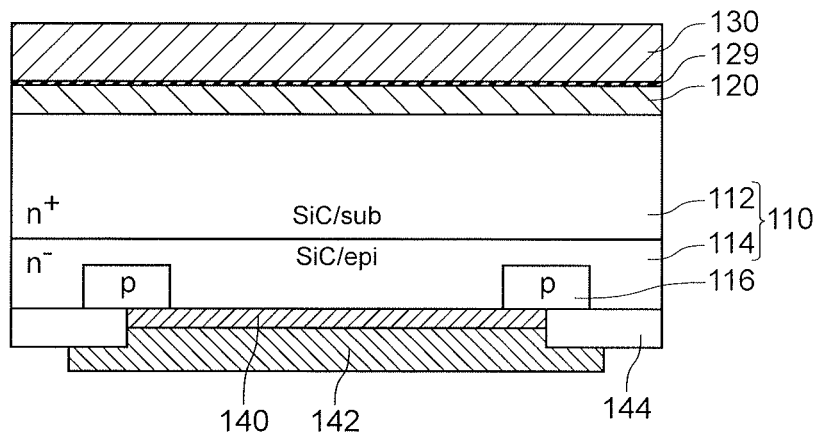
[FIG. 6]
A cross-sectional view of a silicon carbide semiconductor device 102 which is manufactured by a method for manufacturing a silicon carbide semiconductor device according to the embodiment 3.

That is, in the method for manufacturing a silicon carbide semiconductor device according to the embodiment 3, as shown in FIG. 5(a) and FIG. 5(b), the second etching step is carried out under a condition where the oxidation layer formed by the second plasma ashing step partially remains. Accordingly, after the second etching step is finished, on a surface of a reaction layer 120, an extremely thin conductive oxidation layer 129 (layer thickness: approximately 0.3 nm to 2.25 nm, for example) remains as a residual portion of the oxidation layer 128 after etching. Accordingly, in the succeeding steps, as shown in FIG. 5(c) and FIG. 5(d), the extremely thin conductive oxidation layer 129 is present between the reaction layer 120 and the electrode layer 130. Accordingly, in a silicon carbide semiconductor device 102 manufactured by the method for manufacturing a silicon carbide semiconductor device according to the embodiment 3, the electrode layer 130 is not directly formed on the surface of the reaction layer 120 but is formed over the reaction layer 120 with the extremely thin conductive oxidation layer 129 interposed therebetween.

In this manner, although the method for manufacturing a silicon carbide semiconductor device according to the embodiment 3 differs from the method for manufacturing a silicon carbide semiconductor device according to the embodiment 1 with respect to the content of the second etching step, in the same manner as the method for manufacturing a silicon carbide semiconductor device according to the embodiment 1, the etching step is carried out using a hydrochloric acid, a nitric acid and a hydrofluoric acid and hence, both components, that is, a nickel component and a silicon component can be removed by the etching step. Accordingly, there is no possibility that dispersion in device characteristics occurs due to a silicon component remaining after the etching step.

Further, according to the method for manufacturing a silicon carbide semiconductor device of the embodiment 3, the silicide layer is removed by an etching process instead of a CMP process and hence, silicon carbide semiconductor devices can be manufactured with higher productivity than other conventional methods for manufacturing a silicon carbide semiconductor device.

Accordingly, the method for manufacturing a silicon carbide semiconductor device of the embodiment 3, in the same manner as the method for manufacturing a silicon carbide semiconductor device of the embodiment 1, can overcome a drawback that dispersion in device characteristics occurs due to a silicon component remaining after an etching step, and also can manufacture silicon carbide semiconductor devices with high productivity.

Further, according to the method for manufacturing a silicon carbide semiconductor device of the embodiment 3, the silicon carbide semiconductor device 102 having the structure where the electrode layer 130 is formed over the reaction layer 120 with the extremely thin conductive oxidation layer 129 interposed therebetween can be manufactured and hence, compared with the silicon carbide semiconductor device (silicon carbide semiconductor device 100) having the structure where the electrode layer 130 is directly formed on the surface of the reaction layer 120, a resistance between the reaction layer and the electrode layer can be further reduced.

The method for manufacturing a silicon carbide semiconductor device according to the embodiment 3 includes the substantially same steps as the method for manufacturing a silicon carbide semiconductor device according to the embodiment 1 except for the second etching step. Accordingly, the method for manufacturing a silicon carbide semiconductor device according to the embodiment 3 can acquire advantageous effects exactly equal to the advantageous effects acquired by the substantially same steps used in common by the embodiments 1 and 3 out of the advantageous effects that the method for manufacturing a silicon carbide semiconductor device according to the embodiment 1 possesses.

EXAMPLE

This example is provided for explaining that "according to the method for manufacturing a silicon carbide semiconductor device of the present invention, it is possible to overcome a drawback that dispersion in device characteristics occurs due to a silicon component remaining after an etching step." A forward voltage drop VF is used as a device characteristic.

1. Specimen

Silicon carbide semiconductor devices manufactured by the method for manufacturing a silicon carbide semiconductor device according to the embodiment 1 are used as examples of the present invention. On the other hand, silicon carbide semiconductor devices manufactured by the same method as the method for manufacturing a silicon carbide semiconductor device according to the embodiment 1 except for that an etching step is carried out using an etchant containing a hydrochloric acid and a hydrogen peroxide solution (hydrochloric acid: hydrogen peroxide solution=5:1).

2. Evaluation Method

The evaluation of the silicon carbide semiconductor devices according to the examples of the present invention and the evaluation of the silicon carbide semiconductor devices according to the comparison examples are made as follows. 60 silicon carbide semiconductor devices according to the examples of the present invention and 60 silicon carbide semiconductor devices according to the comparison example are prepared. Forward voltage drops VF of the silicon carbide semiconductor devices according to the examples of the present invention and forward voltage drops VF of the silicon carbide semiconductor devices according to the comparison example are measured. The measured forward voltage drops VF of the silicon carbide semiconductor devices according to the examples of the present invention and the measured forward voltage drops VF of the silicon carbide semiconductor devices according to the comparison examples are plotted on a normalized probability distribution graph. In this case, in the normalized probability distribution graph, it is indicated that the greater the inclination of the plotted forward voltage drop VF in the rightward and upward direction, the smaller dispersion in device characteristics is.

3. Evaluation Result

Figure 7:
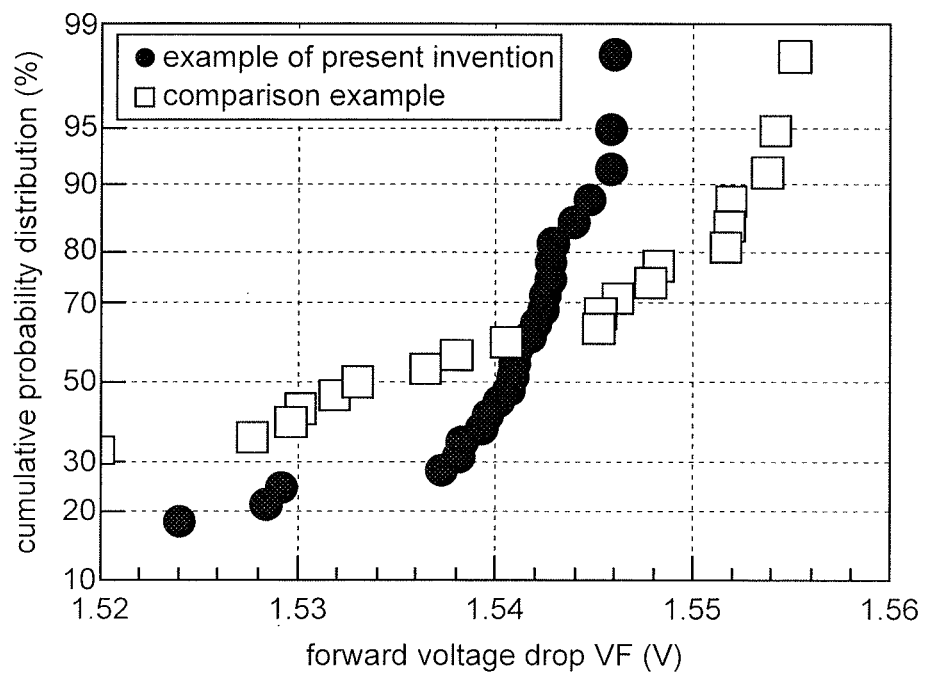
[FIG. 7]
A graph showing the normalized probability distribution showing the result of evaluation of silicon carbide semiconductor devices according to examples of the present invention and silicon carbide semiconductor devices according comparison example.
Figure 8A:
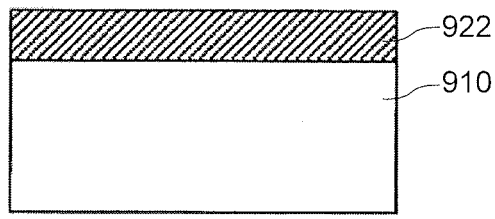
[FIG. 8]
A view for explaining a conventional method for manufacturing a silicon carbide semiconductor device.
Figure 8B:
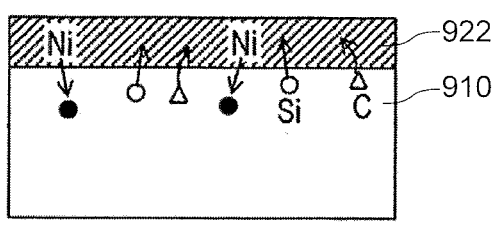
Figure 8C:
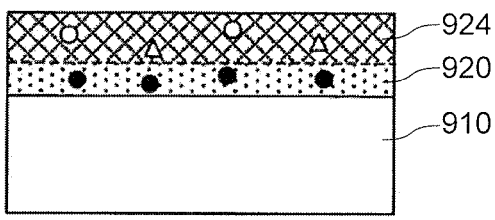
Figure 8D:
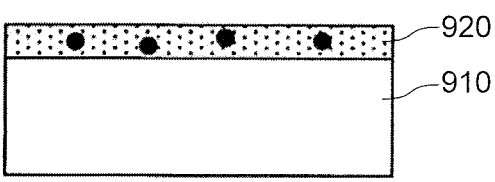
Figure 8E:
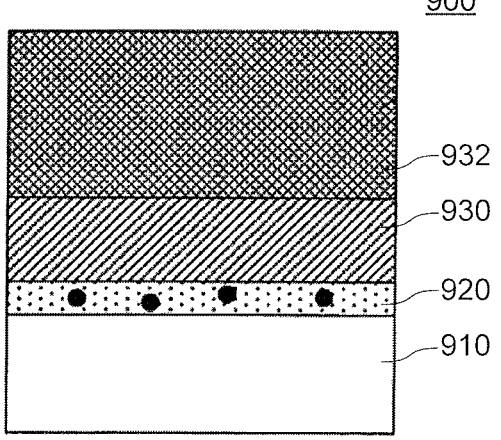

FIG. 7 is a normalized probability distribution graph showing the result of evaluation of the silicon carbide semiconductor devices according to the examples of the present invention and the silicon carbide semiconductor devices according the comparison examples.

As can be clearly understood from FIG. 7, it is found that dispersion in a device characteristic (forward voltage drop) VF) in the silicon carbide semiconductor devices according to the examples of the present invention are smaller than dispersion in a device characteristic in the silicon carbide semiconductor device according to the comparison example. That is, it has become apparent by the examples of the present invention that "according to the method for manufacturing a silicon carbide semiconductor device of the present invention, it is possible to overcome a drawback that dispersion in device characteristics occurs due to a silicon component remaining after an etching step".

Although the present invention has been explained in conjunction with the above-mentioned embodiments heretofore, the present invention is not limited to the above-mentioned embodiments. The present invention can be carried out in various modifications without departing from the gist of the present invention. For example, the following modifications are conceivable.

(1) Although the etching step where an etchant A containing a hydrochloric acid is used and the etching step where an etchant B containing a nitric acid and a hydrofluoric acid is used are carried out in this order in the above-mentioned embodiment 2, the present invention is not limited to such an order. For example, the etching step where an etchant B containing a nitric acid and a hydrofluoric acid is used and the etching step where an etchant A containing a hydrochloric acid is used may be carried out in this order.

(2) The first plasma ashing step and the second plasma ashing step are carried out using an oxygen gas in the above-mentioned respective embodiments. However, the present invention is not limited to such embodiments. For example, the first plasma ashing step and the second plasma ashing step may be carried out using "a hydrogen gas" or "a mixed gas of an oxygen gas and a hydrogen gas" instead of using an oxygen gas.

(3) In the above-mentioned respective embodiments, the whole surface of the reaction layer 120 is exposed by removing the whole silicide layer 124 from the reaction layer 120 and, thereafter, the electrode layer 130 is formed on the surface of the reaction layer 120. However, the present invention is not limited to such embodiments. For example, a portion of the surface of the reaction layer may be exposed by removing a portion of the silicide layer from the reaction layer and, thereafter, the electrode layer may be formed on the surface of the reaction layer.

(4) In the above-mentioned embodiment 3, a portion of the oxidation layer formed by the second plasma ashing step is made to remain by shortening the time of the second etching step. However, the present invention is not limited to such an embodiment. For example, a portion of the oxidation layer formed by the second plasma ashing step may be made to remain by lowering the concentration of a hydrofluoric acid which is contained in an etchant used in the second etching step.

(5) In the above-mentioned embodiment 3, a portion of the oxidation layer (conductive oxidation layer) formed by the second plasma ashing step is made to remain by shortening the time of the second etching step. However, the present invention is not limited to such an embodiment. For example, the oxidation layer (conductive oxidation layer) formed by the second plasma ashing step may be removed while leaving a portion of the oxidation layer by simply cleaning the surface of the reaction layer 120 (using acid cleaning and diluted hydrofluoric acid cleaning) before carrying out the cathode electrode layer forming step while omitting the second etching step.

(6) In the above-mentioned respective embodiments, the present invention has been explained by taking the case where the single electrode layer (cathode electrode layer 130) is formed on the reaction layer 120 as an example. However, the present invention is not limited to such embodiments. The present invention is also applicable to cases where a plurality of electrode layers are formed on the reaction layer.

(7) In the above-mentioned respective embodiments, the method for manufacturing a silicon carbide semiconductor device of the present invention has been explained by taking a Schottky diode as an example. However, the present invention is not limited to such embodiments. For example, the present invention is also applicable to a method for manufacturing a silicon carbide semiconductor device which includes a step where an electrode layer is formed over a silicon carbide layer with a reaction layer such as a power MOSFET, an IGBT, a pn diode or a thyristor interposed therebetween.

(8) In the above-mentioned respective embodiments, the present invention has been explained by taking the case where the n-type silicon carbide layer is used as an example. However, the present invention is not limited to such embodiments. The present invention is also applicable to a case where a p-type silicon carbide layer is used, for example.

REFERENCE SIGNS LIST 100, 102, 900: silicon carbide semiconductor device, 110, 910: silicon carbide layer, 112, 912: $n^+$ type silicon carbide substrate, 114: $n^-$ type epitaxial layer, 116: guard ring, 120, 920: reaction layer, 122, 922: conductive layer, 124, 924: silicide layer, 126: nickel oxide layer, 128: oxidation layer, 129: extremely thin conductive oxidation layer, 130: cathode electrode layer, 140: barrier metal layer, 142: anode electrode layer, 144: protective insulation layer, 930: electrode layer, 932: other electrode layer

The invention claimed is:

1. A method for manufacturing a silicon carbide semiconductor device comprising the steps in the following order:
   a conductive layer forming step where a conductive layer is formed on a silicon carbide layer;
   a heat treatment step where the silicon carbide layer and the conductive layer are made to react with each other thus forming a reaction layer which is in contact with the silicon carbide layer and a silicide layer which is present on the reaction layer;
   a first plasma ashing step where a carbon component which the silicide layer formed in the heat treatment step contains is removed;
   an etching step where at least a portion of the silicide layer is removed using an etchant which contains a hydrochloric acid, a nitric acid and a hydrofluoric acid thus exposing at least a portion of a surface of the reaction layer; and
   an electrode layer forming step where an electrode layer is formed on an upper side of the exposed reaction layer, wherein
   the method further comprises a second plasma ashing step where a carbon component which remains on the reaction layer is removed between the etching step and the electrode layer forming step.

2. The method for manufacturing a silicon carbide semiconductor device according to claim 1, wherein content ratio among the hydrochloric acid, the nitric acid and the hydrofluoric acid which the etchant contains is set such that, assuming the content of the nitric acid as 100 mol, the content of the hydrochloric acid falls within a range of 300 mol to 500 mol, and the content of the hydrofluoric acid falls within a range of 0.1 mol to 5 mol.

3. The method for manufacturing a silicon carbide semiconductor device according to claim 1, wherein the first plasma ashing step is carried out using any one of an oxygen gas, a hydrogen gas and a mixed gas of an oxygen gas and a hydrogen gas.

4. The method for manufacturing a silicon carbide semiconductor device according to claim 1, wherein the second plasma ashing step is carried out using any one of an oxygen gas, a hydrogen gas and a mixed gas of an oxygen gas and a hydrogen gas.

5. The method for manufacturing a silicon carbide semiconductor device according to claim 1, wherein the method further comprises a second etching step where an oxidation layer formed by the second plasma ashing step is removed between the second plasma ashing step and the electrode layer forming step.

* * * * *